(12) United States Patent
Tseng et al.

(10) Patent No.: US 8,803,343 B2
(45) Date of Patent: Aug. 12, 2014

(54) MOBILE SERVER SYSTEM WITH ENERGY REGENERATION FUNCTION

(75) Inventors: Chuang-Wei Tseng, New Taipei (TW); Chi-Min Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 313 days.

(21) Appl. No.: 13/283,588

(22) Filed: Oct. 28, 2011

(65) Prior Publication Data

US 2013/0062888 A1    Mar. 14, 2013

(30) Foreign Application Priority Data

Sep. 14, 2011  (TW) .................................. 100133105

(51) Int. Cl.
 *F02B 63/04*  (2006.01)
 *F03G 7/08*  (2006.01)
 *H02K 7/18*  (2006.01)
 *F16M 3/00*  (2006.01)
 *H05K 7/20*  (2006.01)
 *H01L 41/113*  (2006.01)

(52) U.S. Cl.
 CPC . *F16M 3/00* (2013.01); *H02K 7/18* (2013.01); *H05K 7/20836* (2013.01); *H01L 41/113* (2013.01)
 USPC ....................................................... 290/1 R

(58) Field of Classification Search
 CPC .. H05K 7/20836; H05K 7/1497; F03D 9/002; F05B 2220/602; F05B 2240/40; Y02E 10/725; Y02E 10/728; H01L 41/113; F16M 3/00; H02K 7/18
 USPC .................................. 290/1 R, 55, 54, 44, 43
 See application file for complete search history.

(56) References Cited

U.S. PATENT DOCUMENTS 6,786,051 B2 *  9/2004  Kristich et al. ................. 60/796

* cited by examiner

*Primary Examiner* — Javaid Nasri
(74) *Attorney, Agent, or Firm* — Novak Druce Connolly Bove + Quigg LLP

(57) ABSTRACT

A mobile server system with an energy regeneration function includes a container, at least one server placed within the container, and at least one power generating mechanism received in the receiving portion. Top surface defines a receiving portion. The container defines a through hole communicating with the receiving portion in a position where the at least one server is placed. The power generating mechanism includes an impeller element, a generator and a shaft fixed between the impeller element and the generator. Hot air generated from the at least one server is transmitted to the receiving portion through the through hole to cooperate with cold air from the air to generate airflow. The airflow drives the impeller element to rotate. The shaft is driven by the impeller element to rotate. The generator is driven by the shaft to rotate to generate power.

5 Claims, 2 Drawing Sheets

MOBILE SERVER SYSTEM WITH ENERGY REGENERATION FUNCTION

BACKGROUND

1. Technical Field

The present disclosure relates to mobile server systems and, particularly, to a mobile server system with an energy regeneration function.

2. Description of Related Art

A number of servers are often placed in a mobile server system such as mobile container service station, which is used to provide service for a number of network service access points. However, the servers placed in the mobile container service station generate a substantial amount of heat when working. The servers can be damaged if the amount of heat is not immediately dissipated. Also, the amount of heat is often not utilized in an environment-friendly way.

Therefore, what is needed is a mobile server system with an energy regeneration function to overcome the described limitations.

DETAILED DESCRIPTION

Figure 1:
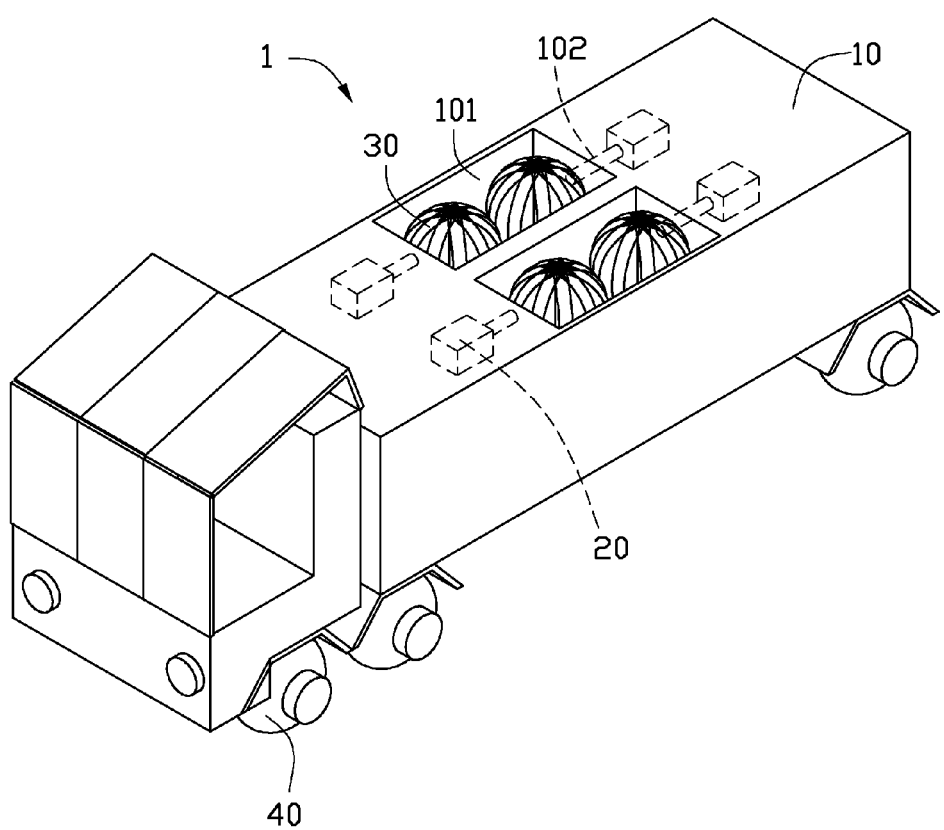
FIG. 1 is an isometric view of a mobile server system, in accordance with an exemplary embodiment.

Referring to FIG. 1, a mobile server system 1 with an energy regeneration function is provided. The mobile server system 1 includes a container 10, and at least one server 20 placed within the container 10. A top surface of the container 10 defines a receiving portion 101. The container 10 defines a through hole 102 in a position where the server 20 is placed. The through hole 102 communicates with the receiving portion 101. The hot air generated by the server 20 is transmitted to the receiving portion 101 by the through hole 102. Hot air from the receiving portion 101 move upward and the cold air from the air move downward, forming air convection to generate airflow.

Figure 2:
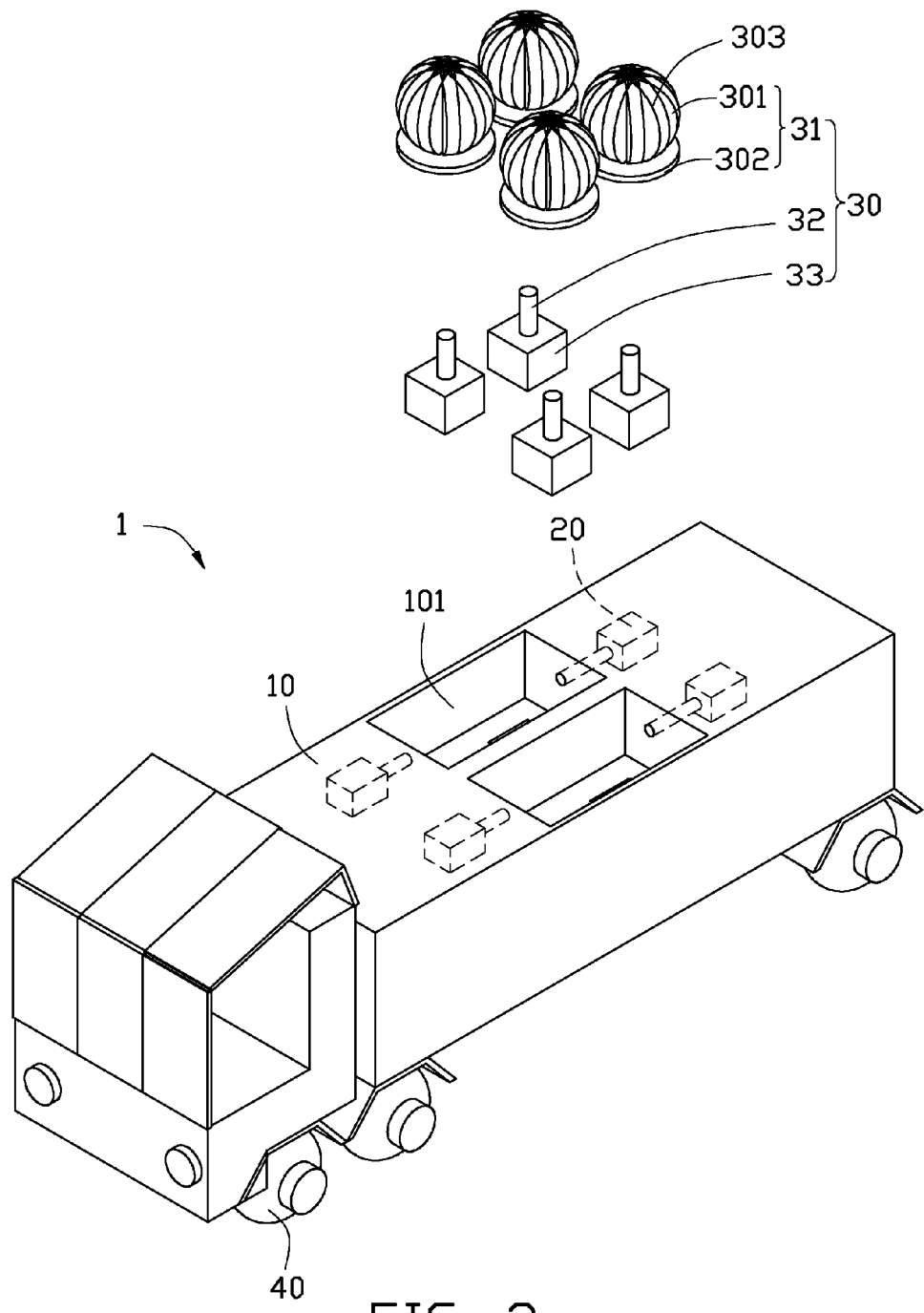
FIG. 2 is an exploded view of the mobile server system of FIG. 1.

Referring to FIG. 2, the mobile server system 1 further includes at least one power generating mechanism 30 received in the receiving portion 101. The power generating mechanism 30 includes an impeller element 31, a generator 33, and a shaft 32 fixed between the impeller element 31 and the generator 33. The impeller element 31 is driven to rotate by the airflow, the shaft 32 is driven to rotate by the impeller element 31. The generator 33 is driven by the shaft 32 to rotate to generate power, thereby transforming the hot energy of the hot air from the server 20 to the kinetic energy to immediately dissipate the amount of heat and achieve energy regeneration. In order to better understand the disclosure, an exemplary embodiment is described in detail.

The mobile server system 1 further includes a number of wheels 40 fixed below the container 10. The number of wheels 40 is able to move by an external force to take the mobile server system 1 to any desired location.

The impeller element 31 includes a base 302 and a rotation element 301 fixed on the base 302. The rotation element 301 includes a number of impellers 303 engaged with each other. The impellers 303 are driven to rotate by the airflow, thereby driving the base 302 to rotate. In one embodiment, the shaft 32 is fixed on the base 302. The rotation element 301 is spherical.

To transform the hot air from the server 20 to the kinetic energy, the hot air generated by the server 20 is transmitted to the receiving portion 101, and cooperates with the cold air from the air to generate airflow. The airflow drives the impeller element 31 to rotate, the shaft 32 is driven by the impeller element 31 to rotate, and the generator 33 is driven to rotate by the shaft 32 to generate power, transforming the hot air from the server 20 to the kinetic energy to achieve energy regeneration. The power generated by the generator 33 can be provided to the server 20 or to other devices.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A mobile server system with an energy regeneration function, comprising:
    a container whose top surface defines a receiving portion;
    at least one server placed within the container, wherein the container defines a through hole communicating with the receiving portion in a position where the at least one server places, and
    at least one power generating mechanism received in the receiving portion, each of the at least one power generating mechanism comprising:
        an impeller element;
        a generator; and
        a shaft fixed between the impeller element and the generator;
    wherein hot air generated from the at least one server is transmitted to the receiving portion through the through hole to cooperate with cold air to generate airflow, the airflow drives the impeller element to rotate, the shaft is driven by the impeller element to rotate, the generator is driven by the shaft to rotate to generate power.

2. The mobile server system as described in claim 1, further comprising a plurality of wheels fixed below the container.

3. The mobile server system as described in claim 1, wherein the impeller element comprises a base and a rotation element fixed on the base, the rotation element comprises a plurality of impeller engaged with each other.

4. The mobile server system as described in claim 3, wherein the shaft is fixed on the base.

5. The mobile server system as described in claim 3, wherein the rotation element is spherical.

* * * * *